United States Patent [19]

Martin

[11] 4,370,629
[45] Jan. 25, 1983

[54] VOLTAGE CONTROLLED OSCILLATOR WITH REDUCED NUMBER OF TUNING POTENTIOMETERS

[75] Inventor: Thomas F. Martin, Richardson, Tex.

[73] Assignee: Rockwell International Corporation, El Segundo, Calif.

[21] Appl. No.: 203,789

[22] Filed: Nov. 3, 1980

[51] Int. Cl.³ .................... H03B 1/00; H03J 5/00
[52] U.S. Cl. .................... 331/179; 331/177 V; 455/186; 455/195; 455/199
[58] Field of Search .................. 331/179, 177 V, 16, 331/36 C; 334/11, 15; 375/65; 455/87, 120, 123, 186, 195, 196, 199, 169, 170, 176, 179, 180

[56] References Cited
U.S. PATENT DOCUMENTS 3,999,131  12/1976  Fukuda et al. .................. 334/15 X
4,249,255  2/1981  Molinari .................. 334/15 X Primary Examiner—Siegfried H. Grimm
Attorney, Agent, or Firm—Michael E. Taken; V. Lawrence Sewell; Howard R. Greenberg

[57]     ABSTRACT

A VCO (Voltage Controlled Oscillator) is provided with a full set of tuning voltages from a reduced number of reference voltage sources, such as potentiometers. Logic controlled switch means delivers any of the reference voltages individually or predetermined combinations thereof as the tuning voltages to the VCO. A reference voltage source potentiometer is provided for each of the odd numbered tuning voltages, and a piecewise linear approximation is provided for the intermediate even numbered tuning voltages by generating the average of two adjacent odd voltages.

6 Claims, 5 Drawing Figures

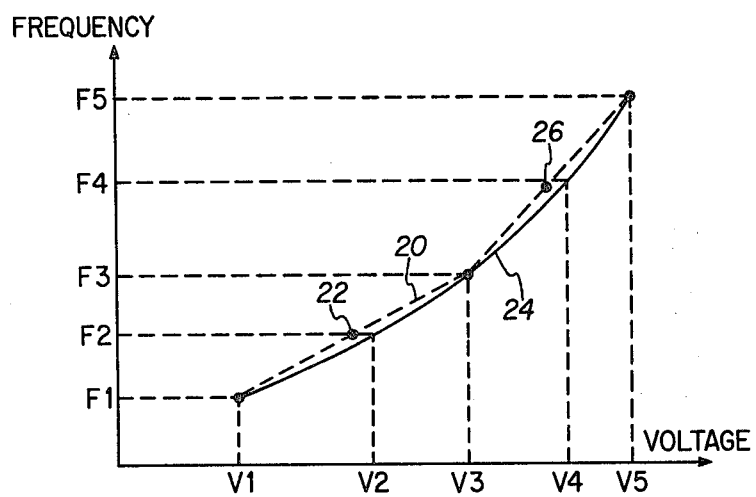
FIG. 1
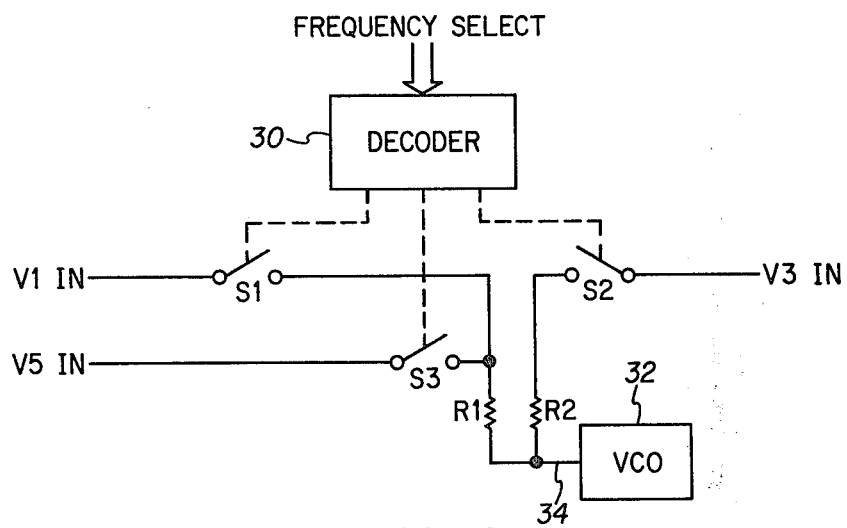
FIG. 2
| FREQ. CODE | S1 | S2 | S3 | VOLTAGE OUTPUT | FREQ. OUTPUT |
|---|---|---|---|---|---|
| 1 | ON | OFF | OFF | V1 | F1 |
| 2 | ON | ON | OFF | (V1+V3)/2 | F2 |
| 3 | OFF | ON | OFF | V3 | F3 |
| 4 | OFF | ON | ON | (V3+V5)/2 | F4 |
| 5 | OFF | OFF | ON | V5 | F5 |
FIG. 3

VOLTAGE CONTROLLED OSCILLATOR WITH REDUCED NUMBER OF TUNING POTENTIOMETERS

TECHNICAL FIELD

The invention relates to the voltage supply system for a VCO (Voltage Controlled Oscillator), and more particularly to the generation of input tuning voltages to the VCO from a reduced number of dedicated reference voltage sources. One application is a satellite video receiver affording 24 frequencies from only 13 reference voltages.

BACKGROUND

Voltage controlled oscillators are known in the art, and output a plurality of known frequencies in response to input tuning voltages in accordance with a known voltage versus frequency characteristic curve for that particular VCO. A dedicated potentiometer, or other stable reference voltage source, is used for each channel or preset frequency. For example, 24 frequency channels require 24 tuning voltages, and hence 24 potentiometers. Each potentiometer is calibrated to adjust its output reference voltage to yield the requisite frequency output from the VCO for that channel. For 24 channels, 24 calibrations are needed.

The total time required to calibrate all of the potentiometers is called alignment time. There is a need to reduce this alignment time because it is costly, requires skilled labor, and slows production. There is a further need to reduce alignment time because the alignment process must be repeated periodically. As the VCO ages, or is affected by temperature, etc., each of the potentiometers must be recalibrated, thus repeating the time-consuming alignment of all channels. There is yet a further need to reduce the large amount of hardware and space needed by systems employing a dedicated potentiometer for each channel.

SUMMARY

The present invention provides an improved voltage supply system for a VCO. The invention enables substantial reduction in alignment time. For example, in one embodiment the invention requires only 13 calibrations for 24 channels. The invention also reduces hardware and space requirements.

The invention enables a full set of tuning voltages to be applied to the VCO from a reduced number of reference voltage sources, such as potentiometers. Logic controlled analog switching means deliver predetermined combinations of the source reference voltages as tuning voltages to the VCO. In preferred form, these combinations include each reference voltage individually, and piecewise linear approximations of requisite intermediate voltages generated from the average of two adjacent reference voltages.

BRIEF DESCRIPTION OF THE DRAWINGS

FIG. 1 graphically illustrates input tuning voltage versus output frequency for a VCO.

FIG. 2 is a schematic diagram of a logic controlled switching circuit for VCO input tuning voltages.

FIG. 3 is a table showing the various voltage combinations provided by the circuit of FIG. 2.

DETAILED DESCRIPTION

Figure 4:
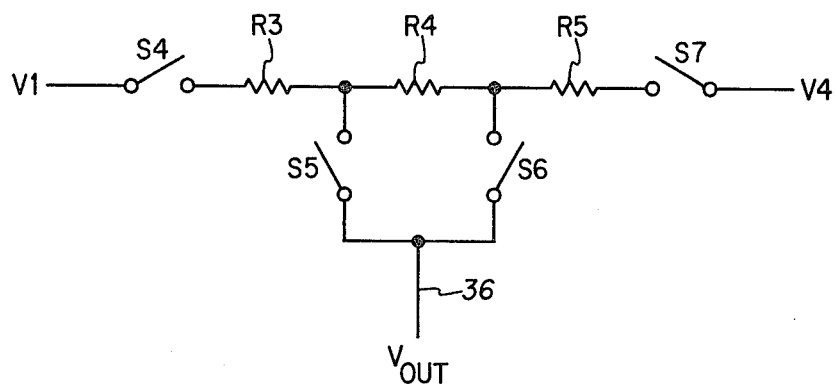
FIG. 4 shows an alternate switching arrangement to FIG. 2.

FIG. 1 is a graph of input tuning voltage to a VCO versus the output frequency of the VCO. For example, if one wishes to receive or tune into channel 4 having a frequency F4, then tuning voltage V4 is applied to the VCO. FIG. 1 shows five channels or preset output frequencies of the VCO. This requires five input tuning voltages. The standard approach in furnishing these five input tuning voltages is to provide five reference source voltages, such as potentiometers or the like. Each potentiometer is dedicated to one tuning voltage and hence to one channel.

FIG. 2 is a schematic circuit diagram of a voltage supply system and switching arrangement constructed in accordance with the invention for providing the five preset frequencies of FIG. 1 in accordance with the five input VCO tuning voltages from only three separate dedicated reference voltage sources, instead of five such dedicated sources. The circuit in FIG. 2 retains the potentiometers or reference sources for voltages V1, V3 and V5, and eliminates the need for the potentiometers or sources supplying voltages V2 and V4. The input VCO tuning voltage required to yield frequency F2 is generated by a piecewise linear approximation by taking the average of the two adjacent voltages V1 and V3.

Referring to FIG. 1, the linear approximated value for V2 falls on straight dashed line 20 halfway between the points for V1 and V3, and is designated as approximated point 22. Point 22 will be slightly offset from the actual values of V2 and F2, depending on the degree of curvature of curve 24. For slight degrees of curvature of curve 24, and for sufficiently wide windows around F2, approximated point 22 is entirely satisfactory for operation of the VCO. Approximated point 26 for V4 and F4 is analogous.

In FIG. 2 a frequency or channel selection code is decoded by decoder 30 for control of switches S1, S2 and S3. The switching arrangement receives the reference voltages V1, V3 and V5 and delivers various combinations thereof as an output voltage to VCO 32.

If the operator wishes to tune the VCO to channel 1, then the channel 1 code is input to decoder 30, which in turn activates switch S1 to an ON condition and switches S2 and S3 to an OFF condition. This yields an output voltage of V1 at output 34 which is the input tuning voltage to VCO 32, resulting in an output frequency F1. Channel 2 is obtained by turning switches S1 and S2 ON and switch S3 OFF. This results in delivery of voltages V1 and V3 through respective resistors R1 and R2 in parallel to output 34. If the value of R1 equals the value of R2, and the input resistance of the VCO 32 is much greater than R1 or R2, then the output voltage on 34 is equal to one-half the sum of V1 and V3. This is the linear approximation to V2 and yields an output VCO frequency very close to F2.

The table in FIG. 3 illustrates the remaining switching combinations for providing tuning voltages V3, V4 and V5. In preferred form, the value of R1 equals the value of R2 to yield an approximated voltage V2 which is halfway between V1 and V3 and to yield an approximated voltage V4 which is halfway between V3 and V5.

FIG. 4 illustrates an alternative switching arrangement for even further reducing the number of reference voltage sources of potentiometers. Instead of retaining every other reference voltage as above, only every third reference voltage is retained. A potentiometer is provided for voltage V1 and V4. Approximated values for V2 and V3 are generated by the switching circuitry. This implementation requires an even greater acceptable window around the approximated frequency values due to the greater deviation of the linear approximation from the actual curve.

In FIG. 4, resistors R3, R4 and R5 have equal resistance values. Voltage V1 is output at 36 when switches S4 and S5 are closed, and S6 and S7 are open. An approximated value for voltage V2 is provided at output 36 when switches S4, S5 and S7 are closed, and S6 is open. This approximated V2 value is one-third between V1 and V4, i.e., the approximated V2 value is equal to $V1 + \frac{1}{3}(V4-V1)$. An approximated value for V3 is provided at output 36 when switches S4, S6 and S7 are closed, and S5 is open. This approximated V3 value is two-thirds between V1 and V4, i.e., the approximated V3 value is equal to $V1 + \frac{2}{3}(V4-V1)$. Reference voltage V4 is provided at output 36 when switches S7 and S6 are closed, and S4 and S5 are open.

Figure 5:
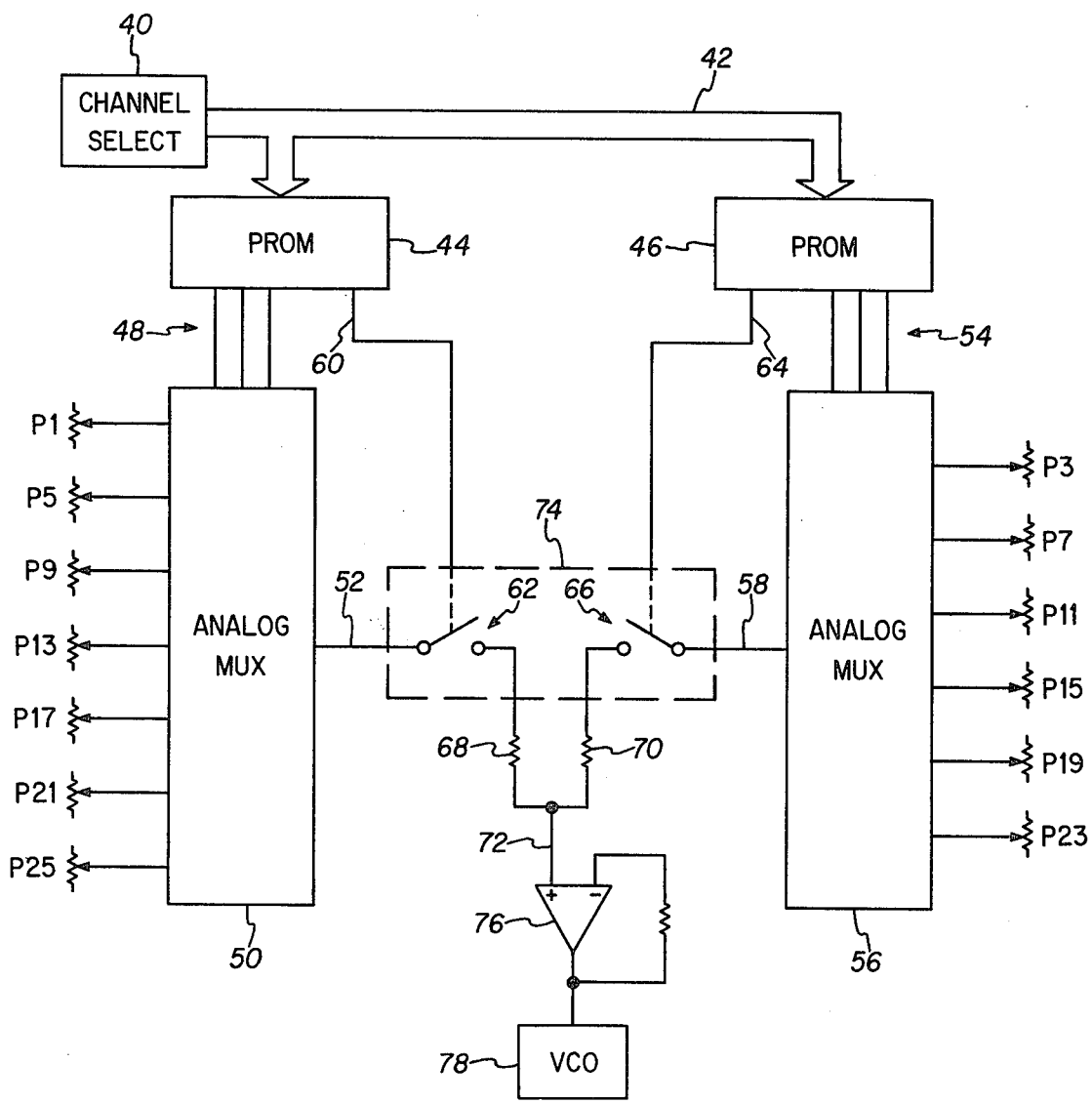
FIG. 5 is a schematic circuit diagram of an embodiment furnishing 24 input VCO tuning voltages from 13 reference voltage potentiometers.

FIG. 5 shows a 24-channel implementation of the invention. This particular implementation is applied in a satellite video receiver and affords 24 frequencies from 13 reference source voltage potentiometers.

A channel selector 40 is operator controlled for choosing the desired preset frequency to be received. A channel or frequency selection code is delivered on bus 42 to decoder means provided by a pair of PROMs 44 and 46, such as type MM6301. PROM 44 outputs a 3 bit control code on lines 48 to an analog multiplex/selector 50, such as a type 4051. This multiplex/selector has 8 input ports, 7 of which are connected to respective potentiometers P1, P5, P9, P13, P17, P21 and P25. The 3 bit control code on lines 48 selects which potentiometer output is passed through mux/selector 50 to output 52. There thus appears on output 52 a reference source voltage from one of the potentiometers input to mux/selector 50. PROM 46 similarly outputs a 3 bit control code on lines 54 to analog multiplexer/selector 56 having input ports connected to 6 potentiometers P3, P7, P11, P15, P19 and P23. The reference voltage output from one of these potentiometers appears on output 58 in accordance with the control code on lines 54.

PROM 44 outputs another bit of control code on line 60 for controlling switch 62. PROM 46 likewise outputs another bit of control code on line 64 for controlling switch 66. The outputs 52 and 58 of mux/selectors 50 and 56 are routed through respective switches 62 and 66 and then through respective resistors 68 and 70 to a common output point 72 comparable to output 34 of FIG. 2 and to output 36 of FIG. 4. Switches 62 and 66, with inputs 52 and 58 and control lines 60 and 64, may be implemented by a gate 74, as shown in dashed line, such as a type 4066. The resistance values of resistors 68 and 70 are equal. Output 72 may be delivered through a buffer amplifier 76, such as a 3403, to VCO 78.

The tuning voltage on 72 to be applied to the VCO is chosen by channel select 40 such that the VCO outputs a preset frequency according to the voltage versus frequency characteristic thereof. The channel 1 frequency is provided when the reference voltage of potentiometer P1 is output on 52, and switch 62 is closed and switch 66 is open. The reference voltage from P1 thus appears on output 72 as the tuning voltage input to VCO 78. Channel 2 frequency is provided when the reference voltage from P1 is delivered to output 52 and the reference voltage from P3 is passed through to output 58, and switches 62 and 66 are both closed. This provides a tuning voltage on output 72 which is one-half the sum of the referenced voltages from P1 and P3. Channel 3 is provided when the reference voltage from P3 is output on 58, and switch 66 is closed and switch 62 is open. Channel 4 is provided when the reference voltage from P3 is on output 58 and the reference voltage from P5 is on output 52, and switches 62 and 66 are both closed. Channel 5 is provided when the reference voltage from P5 is on output 52, and switch 62 is closed and switch 66 is open. Channel 6 is provided when the reference voltage from P5 is on output 52 and the reference voltage from P7 is on output 58, and switches 62 and 66 are both closed. The remaining tuning voltages for the 24 channels are analogously generated.

A reference voltage source potentiometer is provided for each odd frequency (F1, F3, F5, etc.), and a piecewise linear approximation is generated for each of the remaining tuning voltages required for the even frequencies (F2, F4, F6, etc.) by providing the average of the two adjacent odd voltages.

A significant advantage of the implementation of FIG. 5 is the reduced alignment time enabled thereby. Only 13 calibrations are needed for 24 channels. Furthermore, realignment time to compensate for aging, temperature, etc., is also reduced because it is necessary to recalibrate only 13 potentiometers.

It is recognized that various modifications are possible within the scope of the appended claims.

I claim:

1. In a voltage supply system for a VCO (Voltage Controlled Oscillator) generating N preset frequencies in accordance with N input VCO tuning voltages, the improvement comprising:
  a plurality of (N/2)+1 separate dedicated reference voltages, and means for generating said N input VCO tuning voltages from said reference voltages, including switch means for applying predetermined combinations of said reference voltages as said input VCO tuning voltages, a different one of the reference voltages being applied for each odd numbered one of said input VCO tuning voltages, the remaining even numbered ones of said input VCO tuning voltages being equal to one-half the sum of adjacent said reference voltages.

2. A voltage supply system for furnishing N input tuning voltages to a VCO (Voltage Controlled Oscillator) from less than N reference voltage potentiometers, comprising:
  channel selection means for providing a selection code for choosing a designated tuning voltage to be applied to said VCO such that the latter outputs a preset frequency according to the voltage versus frequency characteristic thereof;
  decoder means for receiving said selection code from said channel selection means and outputting a control code;
  M reference voltage potentiometers, where M is less than N;
  analog multiplex/selector means having at least M input ports, each connected to a respective said potentiometer, and responsive to said control code from said decoder means for outputting the voltage from one or more of said potentiometers; and switch means including analog voltage combiner means connected to the output of said multiplex/selector means and responsive to said control code from said decoder means for outputting the voltage from one of said potentiometers or a predetermined combination of voltage values from said potentiometers, the output of said switch means being said tuning voltage.

3. The invention according to claim 2, wherein:

said decoder means comprises first and second memory decoders each receiving said selection code and each outputting a control code;

said analog multiplex/selector means comprises first and second mux/selectors each having a plurality of said input ports connected to respective said potentiometers, and each receiving the control code from its respective said first or second memory decoder for outputting the voltage from one of its respective said potentiometers; and said switch means includes first and second inputs receiving the selected potentiometer output from respective said first and second mux/selectors, said switch means also having first and second control inputs for receiving respective control codes from said first and second memory decoders for outputting either of the voltages from said first and second mux/selectors individually or an approximated value therebetween.

4. The invention according to claim 3 wherein $M=(N/2)+1$, one potentiometer for each of the odd numbered of said input VCO tuning voltages, and wherein the remaining even numbered of said input VCO tuning voltages are furnished as said approximated value by said switch means and equal one-half the sum of adjacent said reference voltages.

5. The invention according to claim 3 wherein a first channel frequency is provided by the reference voltage individually from a first of said potentiometers connected to said first mux/selector, a second channel frequency is provided by said approximated value between the reference voltage from said first of said potentiometers connected to said first mux/selector and the reference voltage from a first of said potentiometers connected to said second mux/selector as combined by said switching means, a third channel frequency is provided by the reference voltage individually from said first of said potentiometers connected to said second mux/selector, a fourth channel frequency is provided by the approximated value between the reference voltage from said first of said potentiometers connected to said second mux/selector and the reference voltage from a second of said potentiometers connected to said first mux/selector as combined by said switch means, a fifth channel frequency is provided by the reference voltage individually from said second of said potentiometers connected to said first mux/selector, the remainder of the N channel frequencies being analogously provided.

6. The invention according to claim 5 wherein $M=(N/2)+1$, one potentiometer for each of the odd numbered of said input VCO tuning voltages, and wherein the remaining even numbered of said input VCO tuning voltages are furnished as said approximated value by said switch means and equal one-half the sum of adjacent said reference voltages, one of said last mentioned reference voltages being provided by one of said potentiometers connected to said first mux/selector and the other of said last mentioned reference voltages being provided by one of said potentiometers connected to said second mux/selector.

* * * * *